(12) United States Patent
Bewick

(10) Patent No.: US 8,049,182 B2
(45) Date of Patent: Nov. 1, 2011

(54) CHARGED PARTICLE FILTER

(75) Inventor: Angus Bewick, Abindon (GB)

(73) Assignee: Oxford Instruments Nanotechnology Tools Limited, London (GB)

( * ) Notice: Subject to any disclaimer, the term of this patent is extended or adjusted under 35 U.S.C. 154(b) by 151 days.

(21) Appl. No.: 12/685,953

(22) Filed: Jan. 12, 2010

(65) Prior Publication Data

US 2011/0168887 A1  Jul. 14, 2011

(51) Int. Cl.
*H01J 37/147* (2006.01)
*H01J 37/26* (2006.01)

(52) U.S. Cl. ................. 250/396 ML; 335/210

(58) Field of Classification Search .......... 250/298, 250/396 R–400, 396 ML; 95/28; 96/1–3; 335/210
See application file for complete search history.

(56) References Cited

U.S. PATENT DOCUMENTS

| | | | | |
|---|---|---|---|---|
| 4,382,183 A * | 5/1983 | Kimura | | 250/310 |
| 4,399,389 A * | 8/1983 | Fleury et al. | | 315/3.5 |
| H591 H * | 3/1989 | Leupold | | 29/607 |
| 4,893,103 A * | 1/1990 | Leupold | | 505/213 |
| 5,044,001 A * | 8/1991 | Wang | | 378/43 |
| 5,347,254 A * | 9/1994 | Leupold | | 335/306 |
| 5,886,609 A * | 3/1999 | Stelter | | 335/306 |
| 5,903,004 A * | 5/1999 | Koshihara et al. | | 250/310 |
| 6,653,637 B2 * | 11/2003 | Ochiai et al. | | 250/397 |
| 6,680,663 B1 * | 1/2004 | Lee et al. | | 335/306 |
| 6,989,533 B2 * | 1/2006 | Bellec et al. | | 250/291 |
| 7,900,343 B1 * | 3/2011 | Leupold | | 29/607 |
| 2009/0128272 A1 * | 5/2009 | Hills | | 335/306 |

OTHER PUBLICATIONS

Herlach, F. et al, "High Magnetic Fields: Science and Technology, v.1," Publisher: Imperial College Press (United Kingdom), 2003, ISBN 9789810249649, p. 31 et seq.

* cited by examiner

*Primary Examiner* — Jack Berman
*Assistant Examiner* — Wyatt Stoffa
(74) *Attorney, Agent, or Firm* — Blank Rome LLP

(57) ABSTRACT

A charged particle filter comprises a magnetic deflector and an outer shield. The magnetic deflector has a bore along an axis thereof passing through the deflector from a specimen end to a detector end of the deflector and through which charged particles pass when in use. The deflector is formed from one or more magnets positioned around the bore in a Halbach configuration thereby generating a relatively high magnetic field strength within the bore and a relatively low magnetic field strength outside of the deflector. The deflector has a geometry defining an outer surface and an inner surface, wherein each of the outer and inner surfaces of the deflector taper towards the axis as a respective function of distance in the specimen direction along the axis. The outer shield is formed from a soft magnetic material surrounding the magnet deflector on an outer surface side of the deflector and having a projecting portion which extends in the specimen direction with respect to the magnetic deflector from the specimen end of the deflector.

13 Claims, 2 Drawing Sheets

US 8,049,182 B2

CHARGED PARTICLE FILTER

FIELD OF THE INVENTION

The present invention relates to a charged particle filter, particularly for use in association with a particle detector in a microanalysis system.

BACKGROUND TO THE INVENTION

With reference to FIG. 1, for x-ray analysis in an electron microscope (EM) 100, an x-ray spectrum is measured by sensing and measuring the energies of individual x-ray photons emitted by a specimen 101 when it is hit by a focussed electron beam 102. Each x-ray photon is an energetic particle and the energy is typically converted into charge using a solid state detector 105. Electrons which are scattered back from the sample, so called "backscattered electrons" (BSE) 103, may also travel towards the x-ray detector. An electron with the same energy as an x-ray photon deposits the same amount of energy in the solid state detector and therefore gives a similar signal charge. Typically, the number of electrons travelling towards the detector is considerably larger than the number of x-ray photons so the signal due to electrons represents a large proportion of the measured x-ray spectrum and can overwhelm the contribution due to x-ray photons. The BSE contribution in the spectrum is typically a large background extending over all energies up to the primary beam energy.

The x-ray detector is usually isolated from the vacuum of the EM by a thin foil of typically polymer supported on a grid with high transparency. If BSE strike the foil or the grid they generate x-ray signals characteristic of the materials in the foil or grid and these x-ray signals appear as a spurious contribution to the recorded x-ray spectrum.

X-ray analysis may be conducted in principle in any apparatus using an incident beam of charged particles (e.g. electrons or ions) and although the following description refers to electrons, the same principles apply in any charged particle apparatus.

The objective of this invention is to find an improved means for preventing BSE from causing an undesirable contribution to the recorded x-ray spectrum, particularly for large area x-ray sensors. We firstly discuss some problems associated with existing methods.

As a result of the incident beam the X-ray photons are emitted in all directions and the x-ray detector only detects photons falling within a cone defined by the active area of the sensor within the x-ray detector. The higher the solid angle defined by this cone, the more signal is collected and this is highly desirable. The solid angle can be increased by increasing the active area of the detector so a large sensor and large aperture are beneficial.

The solid angle can also be increased by pushing the sensor closer to the specimen. However, when the sensor is placed closer to the specimen, the tube structure containing the sensor may collide with the final pole piece 104. This is shown by way of example at point A in FIG. 1. Therefore, it is desirable to minimise the external diameter of the detector tube (shown at B in FIG. 1) to allow the detector to be pushed closer to the specimen without colliding with the conical pole piece of the electron microscope.

Most existing solutions use a pair of permanent magnets to deflect the BSE so that they no longer travel towards the x-ray sensor. In U.S. Pat. No. 4,382,183 (Kimura), and with reference to FIG. 1 thereof, an opposing pair of permanent magnets are connected by a yoke 12. Electrons P, that would otherwise travel towards the sensor 6, are deflected into a region lying between the magnets and sensor where they fall on a grooved absorbing surface that prevents them scattering towards the sensor. A vacuum supporting window is shown at 7 in FIG. 1 of U.S. Pat. No. 4,382,183 and the grooves also help prevent any x-rays, generated by electrons hitting the absorber, from reaching the sensor. X-rays from the specimen 2 have an unrestricted path 1 to the sensor 6.

One problem with this arrangement is the length of the trap which prevents the sensor 6 being placed close to the specimen 2. An additional problem with magnetic electron traps is that the external field produced by the magnet influences the focussed electron beam in the EM. This problem is discussed in detail and is addressed by Ochiai et al in U.S. Pat. No. 6,653,637.

In U.S. Pat. No. 6,653,637, additional permanent magnets are introduced in order to cancel the external field that could influence the focussed electron beam. One embodiment describes an arrangement suitable for a circular detector sensor with area 10 mm$^2$ where the maximum field for diverting electrons at the centre of the gap is 0.3 Tesla. A further embodiment provides a larger aperture sufficient to allow x-rays to fall on a sensor with area 30 mm$^2$ where the maximum field is 0.2 Tesla for deflecting electrons and where the external field is small enough not to interfere with EM operation. However, if larger sensor is to be used, then the aperture must be increased still further. If the embodiment described by FIG. 6 of U.S. Pat. No. 6,653,637 is scaled to provide an aperture large enough to expose a sensor with active area of 80 mm$^2$, without changing the length of the trap, then a series of undesirable effects occur:

a) the field between the magnets that deflects the electrons is substantially reduced;

b) the leakage field that influences the focussed electron beam is substantially increased; and, c) the overall diameter of the external tube for the trap is increased and this makes it more difficult to put the sensor close to the specimen because of collision with the pole piece at points such as A in FIG. 1 herein.

It is problems such as those discussed above that the present invention addresses.

SUMMARY OF THE INVENTION

In accordance with a first aspect of the present invention we provide a charged particle filter comprising:— a magnetic deflector having a bore along an axis thereof passing through the deflector from a specimen end to a detector end of the deflector and through which charged particles pass when in use, the deflector being formed from one or more magnets positioned around the bore in a Halbach configuration thereby generating a relatively high magnetic field strength within the bore and a relatively low magnetic field strength outside of the deflector, wherein the deflector has a geometry defining an outer surface and an inner surface, wherein each of the outer and inner surfaces of the deflector taper towards the axis as a respective function of distance in the specimen direction along the axis; and, an outer shield of soft magnetic material surrounding the magnet deflector on an outer surface side of the deflector and having a projecting portion which extends in the specimen direction with respect to the magnetic deflector from the specimen end of the deflector.

We have realised that an improved configuration of the magnetic deflector can lead to the improved performance of a charged particle filter. The Halbach configuration utilised is one in which, typically, an array of permanent magnets are arranged with respect to one another in such a way that, to one side of the array a relatively high magnetic field strength is generated and to an opposite side of the array a relatively low magnetic field strength is generated. Notably it is possible to use a single magnetic element to perform the function of the array, this having a corresponding variation in the magnetic field vector along its length. In effect such a single element is an array having an infinite number of magnets. For reasons of practicality the array is generally formed from a plurality of substantially identical magnets having different orientations to approximate to a single element having a smoothly varying magnetic field direction as a function of position along the array. Thus, at least three magnets are needed in cases where separate magnets are used. Therefore at least two individual magnets can be identified as having dissimilar magnetic field directions with respect to one another. In the present invention the array surrounds the axis and bore such that the relatively high magnetic field region is within the bore. In principle the magnets could be electromagnets although permanent magnets are considered to be more practical for the present application.

The Halbach configuration is configured such that the magnetic field strength within the deflector is substantially the same as a function of rotation about the axis at a common radius and has a direction within a plane normal to the axis substantially defining an angle with modulus 2X with respect to a first direction within the plane at each position upon a constant radius defined by an angle X with respect to the first direction. It is preferred that the magnets are configured such that the maximum magnetic field strength outside the deflector ("relatively low magnetic field strength") is 10% or less that of the magnetic field strength upon the axis within the deflector ("relatively high magnetic field strength"). In order to achieve the Halbach arrangement typically the magnetic deflector is formed from at least 8 magnets. It is convenient to provide an even number of magnets such that they may be arranged in pairs upon opposing sides of the axis.

The tapering of the inner and outer surfaces allows for the most efficient use of the magnetic field. The minimum diameter of the bore of the deflector is preferably at least 7 millimetres at the detector end so as to allow a large area detector to be used. Furthermore, the ratio of the external diameter of the outer shield to the internal diameter of the inner surface at the detector end of the deflector is less than 2, again this being to maximise the efficient use of the bore diameter. For a given area of detector sensor, the solid angle can be increased by reducing the distance to the specimen. At a given distance from the specimen, the external diameter is constrained by mechanical details of the electron microscope. As the detector is moved closer to the specimen, the constraint on external diameter is usually more severe so it is desirable to maximise the internal diameter relative to the external diameter. Conventional Halbach cylinders usually use a high ratio of external to internal diameter because this increases the internal field. We choose to reduce this ratio to the smallest value that still gives us sufficient internal field to trap electrons.

Since the deflector is typically provided with rotational symmetry, the filter is also generally cylindrical in geometry.

A non-magnetic break may be positioned between the specimen end of the deflector and at least part of the projecting portion of the shield which extends from the deflector in the specimen direction. This further enhances the magnetic field strength in the bore. The projecting portion also "encloses" the deflector to a significant extent in that the bore passes through the projecting portion and the diameter of the bore within part of the projecting portion is less than or equal to the minimum diameter of the bore at the specimen end of the deflector. The bore within the deflector may be lined with a corrugated surface.

The tapering geometry of the deflector provides for improved magnetic performance and allows the filter to be positioned close to the specimen. The deflector typically has rotational symmetry about the axis and each of the outer and inner surfaces are generally frusto-conical. The conic angle of the cone defining the inner surface is typically smaller than that defining the outer surface. Similarly, the outer shield may be provided with a generally frusto-conical external surface which tapers towards the axis as a function of distance in the specimen direction.

The filter may also be fitted with a collimator located within the projecting portion such that the collimator is surrounded by the shield. The collimator may be configured to have an inner surface which acts as an extension or continuation to the inner surface of the deflector.

On the detector side of the deflector, further performance enhancements are provided. A rear shield of soft magnetic material is preferably arranged in a substantially planar manner having a plane normal substantially parallel to the axis and having a bore through which the charge particles pass from the bore of the deflector. This rear shield is positioned facing the detector end of the deflector and spaced therefrom by a gap. Furthermore the gap may be arranged as an annular chamber, positioned at the detector end of the deflector, the chamber having a diameter greater than at least an internal diameter of the bore at the specimen end of the deflector. The diameter of the chamber is preferably greater than the external diameter defined by the outer surface of the deflector at the detector end of the deflector. The rear shield contains the particles within the filter and reduces the stray magnetic field both in the region of the detector and external to the deflector in the region towards the specimen. The chamber provides a region for charged particles to be absorbed whilst minimising the scattering of particles which may otherwise reach the detector.

In accordance with a second aspect of the invention we also provide a particle analyser comprising a charged particle filter according to the first aspect of the invention; and a particle detector positioned upon the axis facing the detector side of the deflector. Preferably the detector is a large area detector having an active surface area of 80 mm$^2$ or more. The detector may take the form of a silicon drift detector.

BRIEF DESCRIPTION OF THE DRAWINGS

A particle filter according to the invention is now described with reference to the accompanying drawings, in which:—

DESCRIPTION OF EXAMPLE

An example filter is now described in the form of an electron filter for use in an x-ray analyser. In the filter, we attempt to maximise the magnetic field across an aperture large enough to expose a circular detector much larger than 30 mm$^2$ while minimising the external field that interferes with the electron microscope. We make use of a well known concept developed by Halbach (see for example, "High Magnetic Fields: Science and Technology, v.1", Fritz Herlach and Noboru Miura, Publisher Imperial College Press (United Kingdom), 2003, ISBN 9789810249649, p31 et seq), the contents of which are incorporated herein by reference. A Halbach array is a special arrangement of, normally, permanent magnets that increases the magnetic field on one side of the array while cancelling the field to near zero on the other side. The magnet array when wrapped into a cylinder produces a strong uniform field, normal to the cylinder axis, within the cylinder, and essentially zero field outside. The ideal cylinder is infinite in length and the magnetisation is continuously varied around the cylinder. However, practical cylinders implemented with only 8 discrete magnets can generate fields as much as 90% of the ideal value. In practice, Halbach cylinders usually have a length similar to their outer diameter. Furthermore, the field in the centre of the cylinder is enhanced by having a high ratio of external to internal diameter and, when the ratio exceeds 2.72, the central field exceeds the remanence of the magnetic material.

Figure 2:
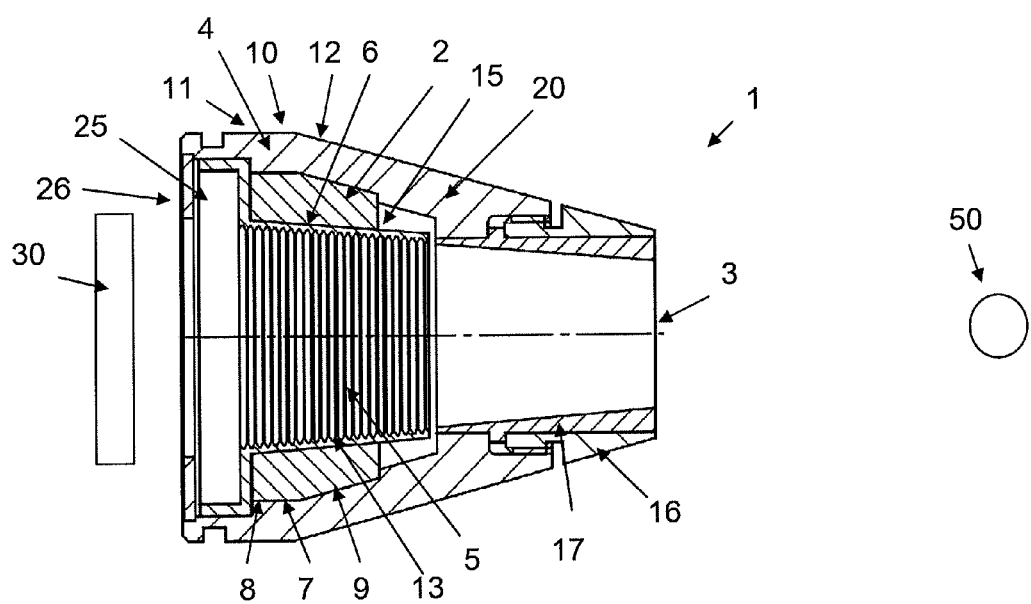
FIG. 2 shows a view, partly in section, of a filter according to a first example of the invention.

Referring to FIG. 2, an example filter 1 is shown, viewed from the side and partly in section. The filter 1 is provided with a magnetic deflector 2 formed from a number of substantially identical permanent magnets arranged in a symmetrical and distributed manner about an axis 3. The magnets are therefore provided around the circumference of a circle having its centre upon the axis 3. Eight such magnets are provided within this example. The magnets are arranged such that for any given magnet, the magnetic field direction is the same as that of the magnet positioned directly opposite from it upon the other side of the axis. The magnetic field direction for each magnet is normal to the axis 3. Given a nominal direction Z normal to the axis 3 and representative of the magnetic field direction of a first magnet in the array, then for any other magnet, N, the angle that the magnetic field vector makes (which lies in the plane normal to the axis 3) with respect to Z is +/−2X for an angular position X of that magnet N. Hence for 8 magnets with angular positions: 0, 45, 90, 135, 180, 225, 270, 315 degrees, the magnetic field vectors have an angle: 0, 90, 180, 270, 360, 450, 540, 630 degrees. Provided the pairs of opposite magnets are retained, the pairs can be rearranged. It is notable that, within the deflector, the resultant primary direction of magnetisation for the array is normal to the axis 3, which is similar to a prior art arrangement using two aligned magnets. The magnets are fabricated from sintered neodymium-iron-boron (Nd—Fe—B) with a maximum energy product of 40 MGOe.

The magnetic deflector 2 is provided at a first radius from the axis 3 and has a bore 5 passing through it, which is centred upon the axis 3. In FIG. 2 a specimen, shown schematically at 50, from which particles are received for analysis is positioned to the right of the filter 1 and a detector 30 is positioned to the left of the filter 1 such that the filter is interposed between the specimen and detector.

The magnetic deflector 2 is surrounded by an outer shield 4 of a soft magnetic material (mild steel in this case). Each of the magnetic deflector 2 and outer shield 4 are elongate along the axis 3 such that all parts of the deflector are enclosed by the outer shield 4 in a coaxial manner. However the outer shield 4 extends further along the axis 3 in each direction with respect to the magnetic deflector 2.

The internal surface of the deflector 2 facing the axis 3 is a tapered inner surface 6, this comprising the entire inner surface of the deflector facing the axis and is arranged to taper in the direction of the specimen 50. The tapering is such that the inner surface 6 is a frustro-conical surface of a right-circular cone having an apex at or beyond the location of the specimen 50. The external surface of the deflector 2 has two parts defining an outer surface 7, a first part 8, distal from the specimen, which is arranged as a right-circular cylindrical surface (having a constant radius with respect to the axis 3) and a second part 9, more proximate to the specimen, this having a frusto-conical surface in an analogous manner to the inner surface 6, although more steeply tapered in the direction of the specimen (having a larger conic apex angle). The outer surface 9 conforms with and is adjacent to a corresponding inner surface of the outer shield 4. An outer surface 10 of the outer shield 4, similarly has cylindrical 11 and tapering 12 parts at generally corresponding positions, the cylindrical surface 11 extending in the detector direction with respect to the deflector and the tapering surface 12 extending significantly (for example by an amount equal to at least the length of the deflector) in the specimen direction. The part of the tapering surface 12 beyond the deflector forms a projecting portion 20 of the outer shield 4.

The inner surface 6 of the deflector does not open onto the bore 5 directly since the bore is lined with a liner 13. In a known prior design of electron trap with simply two opposing magnets, electrons are deflected perpendicular to the normals of the magnets and can be directed into a void between the magnets which subtends a low solid angle at the sensor or into a separate region with serrations. However, with the present example which has a continuous magnetic structure along the axis 3, electrons starting on a trajectory close to one side of the inner cylinder surface are likely to be deflected into the surface and scatter or generate x-rays. For this reason the liner 13 is formed from a low-atomic-number material which has a serrated (for example, corrugated) surface to minimise the number of scattered electrons or x-rays excited by scattered electrons from reaching the detector 30. In this case carbon-coated aluminium is used. The liner 13 extends in the specimen direction with respect to the deflector 2.

The end of the deflector 2 which faces the specimen 50 is formed as an annular face. Thus, a small chamber is provided adjacent the end of the deflector, this being bounded by the extending part of the liner, the annular end of the deflector and inner surfaces of the outer shield 4. The inner surfaces of the outer shield comprise a surface which is generally parallel to the tapering part 12 of the outer surface 10, this terminating to define an inner surface in the form of an annular wall which faces the end face of the deflector with a void therebetween. The small chamber thereby formed is in gaseous communication with the bore and therefore, when in use, is evacuated. This chamber defines a magnetic break 15 which increases the field in the bore at the entrance to the magnetic deflector.

The outer shield 4 is fitted with a detachable nose portion 16 which is mounted to the outer shield 4 within the projecting portion 20. This is constructed from a similar material to the rest of the outer shield. An end region of the projecting portion 20, together with the adjacent detachable nose portion each have an inner surface which is a right-cylindrical surface of similar radius, whereas the outer surface of the nose portion 16 is a frusto-conical surface which is a continuation of the outer surface 12 of the outer shield 4 in the specimen direction.

The bore 5 passes through the projecting portion 20 of outer shield 4 and also the detachable nose portion 16. A collimator 17 is located within the bore 5, which forms the outer wall of the bore extending from a location adjacent the specimen end of the liner 13 to the end of the filter 1 where each of the collimator 17 and nose portion 16 have a coplanar annular surface facing the detector 30. The collimator has an outer surface which conforms with the inner cylindrical surfaces of the projecting and nose portions. The collimator also has an inner surface which is tapered in a frusto-conical manner so as to act as a continuation of the serrated inner surface of the liner 13 (and thus has a similar conic apex angle). The collimator 17 is formed from carbon-coated aluminium in a similar manner to the liner 13. The detachable nose portion 16 allows detachable collimators of different designs/sizes to be fitted but still retains the magnetic shield properties.

At the detector end of the magnetic deflector 2, the deflector has an annular face which faces along the axis 3 towards the detector 30 (away from the specimen 50). The face extends to the full outer radius of the deflector 2 and defines one side of an annular chamber 25 ("pocket") which extends in the axial direction and is bounded at its circumference by an inner surface of the part of the outer shield 4 which extends in the detector direction along the axis. The side of the chamber which faces the deflector is formed from an annulus of soft magnetic material which is a rear shield 26, magnetically connected with the outer shield 4. The tapering bore 5 opens into the annular chamber 25 and passes, with a similar conic angle, through the rear shield 26. The walls of the chamber bounded by the deflector face and outer shield 4 are lined with an extension of the liner 13 which conforms with these surfaces.

Behind the rear shield 26 the x-ray detector 30 is positioned, this having an active area of 80 mm$^2$. Due to the use of the frusto-conical surfaces, each part of the active area of the detector has line-of-sight along the bore 5 to the specimen 50. The filter 1 and detector 30 together constitute an x-ray analyser for use in the analysis of the specimen.

The deflector 2 has a sufficient internal diameter (preferably at least 10 mm at the detector end) so that a detector 30 with area 80 mm$^2$ or greater can be exposed to the x-rays. The length of the deflector is much less than the outer diameter and significantly less than the internal diameter. For the present example the external to internal diameter ratio is less than 2 and ideally less than 1.5. The effect of the projecting and nose portions of the outer shield is to minimise the external field in the vicinity of the specimen.

When the apparatus is in use x-rays and electrons are generated by an electron beam which impinges upon the specimen 50. Some of these x-rays and electrons enter the bore 5 at the specimen end of the filter and travel along the bore. The x-ray photons follow linear paths and the frusto-conical internal surfaces of the bore 5 ensure that the paths of the x-ray photons which enter the bore 5 are not hindered and these pass through the rear shield to the detector 30. Unlike the x-ray photons whose trajectories cannot be readily deviated, the electrons from the specimen which enter the bore have trajectories which may be influenced by the presence of an electric or magnetic field. The stronger the field, the greater the deflection. The Halbach arrangement of permanent magnets within the deflector 2 provides magnetic field lines which are substantially normal to the axis 3 when within the bore of the deflector. Electrons travelling within the deflector are themselves deflected strongly (in a direction given by the vector cross product of the magnetic field direction and the electron trajectory vector). The electrons are therefore deflected towards the wall of the bore 5 and they typically impact with the serrated liner 13. The provision of the serrated liner presents a series of ridges having faces which are angled towards the specimen 50 (and therefore away from the detector 30). The particles which reach the detector 30 are therefore preferably exclusively x-ray photons from the specimen rather than either electrons from the specimen or filter, or x-rays from the filter.

The provision of the annular chamber 25 provides an advantageous further region for the impact of the electrons or indeed emitted x-ray photons (from within the detector) with the "wall" of the bore. This region further reduces the chances of the scattering of the electrons (or reemitted photons) from reaching the detector.

In order to demonstrate the effectiveness of a number of the features of the present example, the performance of the example was tested against a modified comparative "basic design" example in which a number of these features were absent. The basic design has the following features:—

Basic Design

Comparative Example—Key Magnetic Characteristics (1) Halbach magnet array—inner and outer surfaces are cylindrical
 a. Maximum gap field for given annular magnetic material volume and energy product;
 b. Minimum stray field for given annular magnetic material volume and energy product;
(2) Shape of magnetic shield in front of magnet:
 a. Short Forward extension to reduce stray field;
 b. External Diameter tapered to fit required geometry;
(3) Rear shield to reduce stray field leakage at rear which reduces stray field everywhere;
(4) Non-magnetic break at the front of the magnet helps maintain high gap field.

Figure 3:
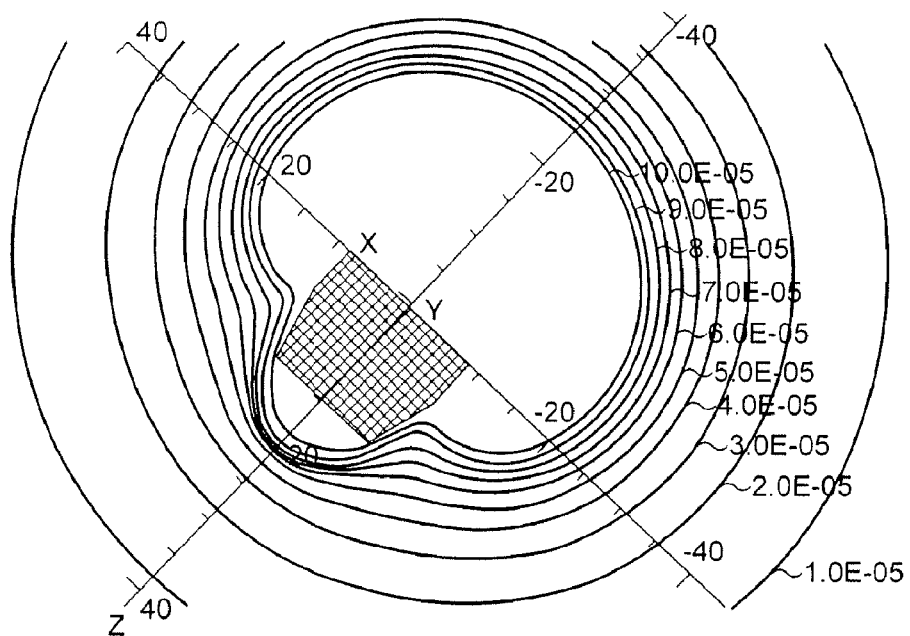
FIG. 3 shows the flux distribution of a comparative filter with a number of the features removed to illustrate their effect; and, FIG. 4 shows the flux distribution according to the filter of the first example.

FIG. 3 shows the simulated flux distribution for the basic design. This has a Halbach array arranged as a regular right-circular cylinder with a 10 mm exit diameter. The outermost contour corresponds to 10$^{-5}$ Tesla. In the basic design using a standard Halbach cylinder achieved a maximum internal field of 0.17 Tesla and an external field distribution shown in FIG. 3 where the black silhouette corresponds to the electron filter and the downward black arrow shows the direction of the focussed electron beam incident on the specimen for one particular specimen-detector distance. Although this prevents the majority of electrons reaching the detector sensor, the recorded x-ray spectrum still shows the presence of a spurious contribution from the small fraction of backscattered electrons that reach the detector. Furthermore, the leakage field can still cause disturbance of the incident electron beam when the detector is moved close to the specimen.

To address the deficiencies of the basic example design the following features were introduced into the present example of the invention:—

Present Example

Additional Characteristics (1) Tapered Halbach magnet array
 a. Taper on external diameter to reduce magnetic volume and hence stray field;
 b. Taper on Internal Diameter (maximised but within minimum aperture constraint) to maintain high External:Internal Diameter ratio and hence field in bore;
(2) Shape of magnetic shield in front of magnet—Outer Shield covers full extent of filter (including collimator) to minimise stray field;
(3) Large diameter pocket at rear of magnet to sink high-angle secondary electrons generated within the filter.

Figure 1:
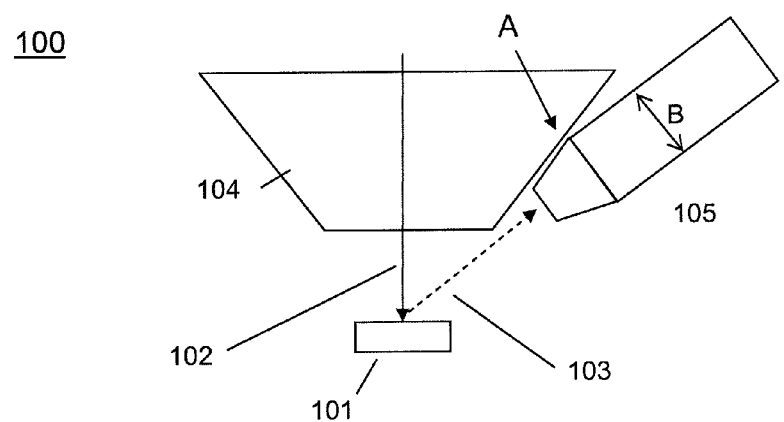
FIG. 1 shows the arrangement of components in the vicinity of a specimen in a scanning electron microscope.

The deflector is provided with a tapering external surface. As shown in FIG. 1, it is beneficial for the outer soft metal shield to also maintain a tapered external profile. If a regular cylinder is used for the Halbach deflector, then a tapered shield becomes very thin at the corner of the magnet cylinder. A Halbach cylinder produces stronger field as the ratio of external/internal diameter is increased. Since x-rays excited from the small focussed beam spot specimen that reach the detector fall within a cone with its base on the detector sensor, user can be made of the volume outside of this cone provided it does not obscure the x-ray path. Therefore, the magnetic deflector is tapered so that both the outer and inner diameters decrease in the direction towards the specimen. This maximises the thickness of screening material outside the magnet and maintains a useful thickness of material in the magnet cylinder.

On the specimen side of the Halbach deflector, a non-magnetic break is used between the magnet and outer shield as this enhances the on-axis field within the deflector. The shield of soft magnetic material is extended further towards the specimen. A large diameter rear annular chamber or "pocket" is included to provide a further trap for those electrons that have suffered multiple scattering events or are following highly-curved trajectories after passing through the strong magnet field.

Figure 4:
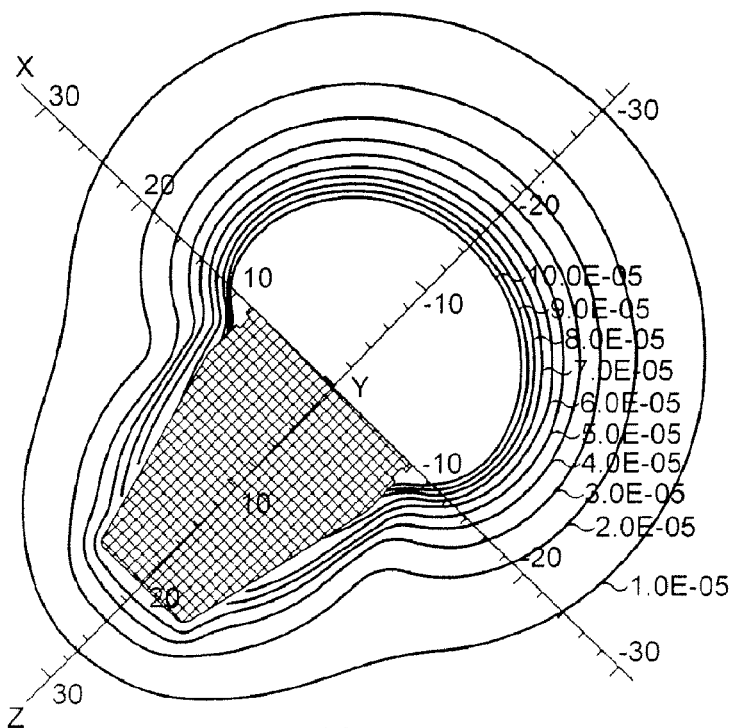

With the additional features, the field in the bore of the deflector is substantially increased. The field at the centre of magnet bore is measured to be 0.23 Tesla which is significantly higher than the 0.17 Tesla for the basic example. Furthermore, the leakage field is substantially reduced as shown in FIG. 4. The incident electron trajectory in the electron beam now passes through a much weaker field and the influence of the electron trap on microscope operation is considerably reduced.

Thus, in contrast to prior art, we provide an effective method to trap electrons for detector sensors at least as large as 80 mm$^2$ and achieve this within a small envelope that allows the detector to be positioned close to the specimen to achieve high solid angle without colliding with the final lens pole piece and without producing a stray field at the specimen sufficient to cause significant distortion of the electron microscope image.

The invention claimed is:

1. A charged particle filter comprising:
    a magnetic deflector having a bore along an axis thereof passing through the deflector from a specimen end to a detector end of the deflector and through which charged particles pass when in use, the deflector being formed from one or more magnets positioned around the bore in a Halbach configuration thereby generating a relatively high magnetic field strength within the bore and a relatively low magnetic field strength outside of the deflector, wherein the deflector has a geometry defining an outer surface and an inner surface, wherein each of the outer and inner surfaces of the deflector taper towards the axis as a respective function of distance in the specimen direction along the axis; and, an outer shield of soft magnetic material surrounding the magnet deflector on an outer surface side of the deflector and having a projecting portion which extends in the specimen direction with respect to the magnetic deflector from the specimen end of the deflector.

2. A filter according to claim 1, wherein the minimum diameter of the bore within the deflector is at least 7 millimeters at the detector end of the deflector.

3. A filter according to claim 1, wherein the ratio of the external diameter of the outer shield to the internal diameter of the inner surface at the detector end of the deflector is less than 2.

4. A filter according to claim 1, wherein the maximum magnetic field strength outside the deflector is 10% or less that of the magnetic field strength upon the axis within the deflector.

5. A filter according to claim 1, wherein the magnetic deflector is formed from at least 8 magnets.

6. A filter according to claim 1, further comprising a non-magnetic break positioned between the specimen end of the deflector and at least part of the projecting portion of the shield which extends from the deflector in the specimen direction.

7. A filter according to claim 1, wherein the bore passes through the projecting portion and the diameter of the bore within part of the projecting portion is less than or equal to the minimum diameter of the bore at the detector end of the deflector.

8. A filter according to claim 1, wherein the collimator has an inner surface which acts as an extension to the inner surface of the deflector.

9. A filter according to claim 1, further comprising a rear shield of soft magnetic material arranged in a substantially planar manner having a plane normal substantially parallel to the axis and having a bore through which the charge particles pass from the bore of the deflector, the rear shield being positioned facing the detector end of the deflector and spaced therefrom by a gap.

10. A fitter according to claim 1, further comprising an annular chamber positioned at the detector end of the deflector, the chamber having a diameter greater than at least an internal diameter of the bore at the detector end of the deflector.

11. A filter according to claim 1, wherein the outer shield is provided with a generally frusto-conical external surface which tapers towards the axis as a function of distance in the specimen direction.

12. A filter according to claim 1, wherein the bore within the deflector is lined with a corrugated surface.

13. A particle analyser comprising:
    a charged particle filter according to claim 1; and
    a particle detector positioned upon the axis facing the detector side of the deflector.

* * * * *